US007266485B2

(12) United States Patent
Maeshima et al.

(10) Patent No.: US 7,266,485 B2
(45) Date of Patent: Sep. 4, 2007

(54) METHOD FOR MAKING EQUIVALENT CIRCUIT MODEL OF PASSIVE ELEMENT, SIMULATOR, AND STORAGE MEDIUM

(75) Inventors: Hiroyuki Maeshima, Hyogo (JP); Yoichi Aoshima, Osaka (JP); Yasuhiro Kobatake, Osaka (JP); Yoji Masuda, Kyoto (JP); Mamoru Ito, Hyogo (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 641 days.

(21) Appl. No.: 10/258,700

(22) PCT Filed: Feb. 20, 2002

(86) PCT No.: PCT/JP02/01444

§ 371 (c)(1),
(2), (4) Date: Feb. 14, 2003

(87) PCT Pub. No.: WO02/068972

PCT Pub. Date: Sep. 6, 2002

(65) Prior Publication Data

US 2003/0173979 A1    Sep. 18, 2003

(30) Foreign Application Priority Data

Feb. 27, 2001    (JP)    ............................. 2001-051801

(51) Int. Cl.
*G06F 17/50*    (2006.01)
*G01R 25/00*    (2006.01)
(52) U.S. Cl. .......................................... 703/13; 702/65
(58) Field of Classification Search .................... 703/4, 703/13, 2, 3, 14; 702/65; 716/3
See application file for complete search history.

(56) References Cited

U.S. PATENT DOCUMENTS 2,965,859 A * 12/1960 De Monte ................... 333/23

6,137,293 A * 10/2000 Wu et al. .................... 324/638
6,321,169 B1 * 11/2001 Iwao ............................. 702/65

FOREIGN PATENT DOCUMENTS

JP    63-204162    8/1988
JP    04-307663    10/1992

OTHER PUBLICATIONS

"High Accurate Equivalent Circuit Models of Capacitors", Mar. 7, 2000, vol. 2000, No. 5, p. 16.
Japanese search report for PCT/JP02/01444 dated Apr. 23, 2002. dated Apr. 9, 2002.
English translation of Form PCT/ISA/210.

* cited by examiner

*Primary Examiner*—Paul Rodriguez
*Assistant Examiner*—Eunhee Kim
(74) *Attorney, Agent, or Firm*—RatnerPrestia

(57) ABSTRACT

A method of deriving an equivalent circuit model for a passive component includes a first step of providing a given frequency characteristic of a capacitor, a second step of forming one of an RC circuit, an RL circuit, and an RCL circuit using frequency-independent resistances (R), capacitances (C) and/or inductances (L), as the equivalent circuit model representing a circuit capable of performing a simulation in a time domain, a third step of composing an evaluation function for evaluating accuracy of the equivalent circuit model formed in the second step, and a fourth step of determining values of the circuit components by minimizing the evaluation function composed in the third step. The method with a simulator adapted for implementing this method and a computer-readable storage medium containing a recorded program, derives the equivalent circuit model for a capacitor. The model is capable of performing a simulation in the time domain using a common procedure not dependent upon types of passive components.

12 Claims, 8 Drawing Sheets

| Rc(1) | 1.24 × 10⁻⁰² | C(1) | 2.25 × 10⁻⁰⁵ |
|---|---|---|---|
| Rc(2) | 6.00 × 10⁻⁰² | C(2) | 3.85 × 10⁻⁰⁵ |
| Rc(3) | 3.90 × 10⁺⁰⁰ | C(3) | 2.07 × 10⁻¹⁷ |
| Rc(4) | 8.04 × 10⁺⁰¹ | C(4) | 2.79 × 10⁻⁰⁶ |
| Rc(5) | 1.67 × 10⁺⁰³ | C(5) | 4.99 × 10⁻⁰⁶ |
| RL(1) | 5.24 × 10⁻⁰³ | L(1) | 1.24 × 10⁻⁰⁹ |
| RL(2) | 2.66 × 10⁻⁰¹ | L(2) | 9.59 × 10⁻⁰⁹ |
| RL(3) | 2.18 × 10⁺⁰⁰ | L(3) | 4.51 × 10⁻⁰⁹ |
| RL(4) | 3.41 × 10⁺⁰¹ | L(4) | 3.68 × 10⁻⁰⁶ |
| RL(5) | 5.35 × 10⁺⁰² | L(5) | 4.65 × 10⁻¹⁶ |

METHOD FOR MAKING EQUIVALENT CIRCUIT MODEL OF PASSIVE ELEMENT, SIMULATOR, AND STORAGE MEDIUM

FIELD OF THE INVENTION

The present invention relates to a method for deriving equivalent circuit model of passive components. The invention relates particularly to a method for deriving the equivalent circuit models, a simulator, and a storage medium that are capable of performing simulation in a time domain by a common procedure which is independent from types of the passive components.

BACKGROUND OF THE INVENTION

According to trend toward use of high frequencies and high-speed digitization in data communication devices, it has been important recently to perform highly accurate circuit simulation in a time domain of electronic circuits including passive components.

Regarding the electronic devices, it is very difficult to estimate electric characteristics of a complicated electronic circuit when the circuit is being designed. For manufacturing the circuit, a lot of trial is repeated in which an actual prototype assembly of the circuit is made and measured in its electric characteristic, and the circuit is designed over again if the assembly does not exhibits desired electric characteristic.

Circuit simulations for estimating electric characteristics of the electronic circuit are performed with a circuit simulator consisting of a computer and software in order to reduce the trial. As the software, for example, a Simulation Program with Integrated Circuit Emphasis (SPICE) developed by the University of California is known.

A circuit simulation requires an equivalent circuit model, which specifies electric characteristics of semiconductor devices, such as transistors, FETs, and diodes, and passive components, such as resistors, capacitors, and inductors. It is important to establish a highly accurate equivalent circuit model of the circuit components since accurateness of the circuit simulation depends greatly upon accuracy of the equivalent circuit model.

For a capacitor, one of the passive components, equivalent circuit models that use comparatively small number of circuit components have been provided. The model includes a three-element model in which first capacitor $C_1$, first resistor $R_1$, and first inductor $L_1$ are connected in series as shown in FIG. 6A, and a five-element model in which a series connection of first capacitor $C_1$ and first resistor $R_1$ and a series connection of second capacitor $C_2$ and second resistor $R_2$ are connected in parallel, and first inductor $L_1$ is connected in series to the parallel circuit, as shown in FIG. 6B. However, these conventional equivalent circuit models do not have satisfying accuracy. As shown in FIGS. 6C and 6D, the conventional models hardly reproduce an impedance having complex frequency dependence. FIG. 6C shows a real part of the impedance, and FIG. 6D shows a capacitance component of the impedance. Calculated values of a three-element model are represented by solid lines, and calculated values of a five-element model are represented by broken lines. FIGS. 6C and 6D show large differences between the calculated values and actually-measured values given by dotted lines.

Therefore, for electronic circuits including capacitors, an estimation result of a circuit simulator does not often match with electric characteristics of an actual circuit, and this prevents electronic circuits using the circuit simulator from being designed efficiency.

DISCLOSURE OF THE INVENTION

By a method for deriving an equivalent circuit model, a circuit simulator accurately estimates electric characteristics of an actual passive component.

The method includes:

Providing impedance $Z(f_n)$ at each of sample frequencies $f_1, \ldots, f_N$ (where $f_1 < f_n$) is given as $$Z(f_n) = R(f_n) + jX(f_n),$$

where
  Z is the impedance of a capacitor,
  R is a real part of Z,
  X is an imaginary part of Z,
  $f_n$ is a value of each sample frequency (n=1, 2, . . . ,N), and
  j is the imaginary unit;

Forming an equivalent circuit model by adopting any of an RC circuit consisting of a resistance and a capacitance, an RL circuit consisting of a resistance and an inductance, and an RCL circuit consisting of the RC circuit and the RL circuit connected in series;

Composing an evaluation function $Q(\vec{P})$ in accordance with formulae:

$$Q(\vec{P}) = \sum_{n=1}^{N} q(R_M(f_n, \vec{P}), X_M(f_n, \vec{P}), R(f_n), X(f_n)); \text{ and}$$

$$q(R_M, X_M, R, X) = C_R \frac{|R_M - R|^2}{|R|^d} + C_X \frac{|X_M - X|^2}{|X|^d} + C_Z \frac{|Z_M - Z|^2}{|Z|^d},$$

where an impedance of the equivalent circuit model is defined as $$Z_M(f_n, \vec{P}) = R_M(f_n, \vec{P}) + jX_M(f_n, \vec{P}),$$

where,
  $Z_M$ is the impedance of the equivalent circuit model,
  $R_M$ is a real part of $Z_M$,
  $X_M$ is an imaginary part of $Z_M$,
  $f_n$ is the value of each sample frequency (n=1, 2, . . . ,N),
  j is the imaginary unit,
  $\vec{P} = (P_1, P_2, \ldots P_K)$ is a circuit constant vector including elements being values of R, C and L, and
  $C_R$, $C_X$, and $C_Z$ are positive real numbers or zero; and Determining the circuit constant vector $\vec{P}$ by minimizing the evaluation function $Q(\vec{P})$.

This method of deriving equivalent circuit model is applicable commonly to capacitors regardless of their kinds, and is also applicable in general to other passive components, such as resistors and inductors.

DESCRIPTION OF THE PREFERRED EMBODIMENT

Exemplary Embodiment 1

Figure 1:
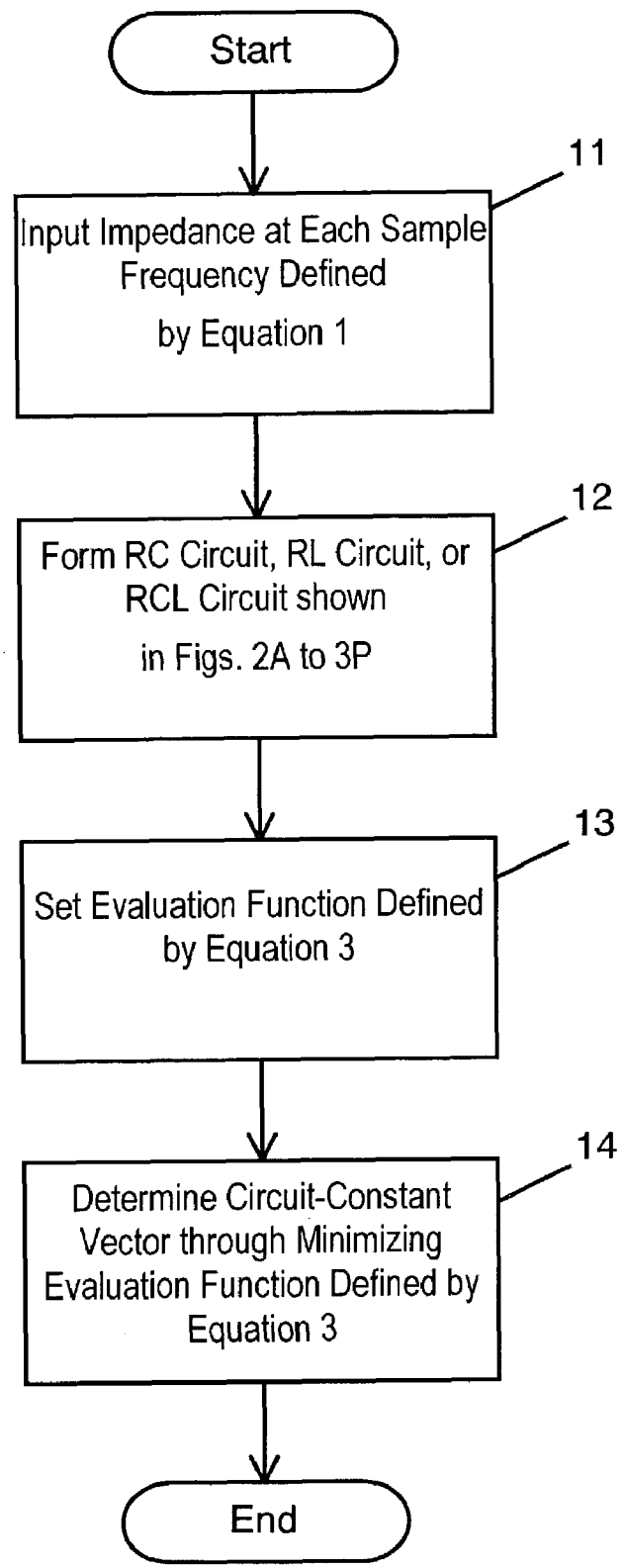
FIG. 1 is a flowchart showing a method for deriving an equivalent circuit model of a capacitor according to exemplary embodiments of the present invention.

FIG. 1 is a flowchart of processes in a method for deriving an equivalent circuit model of a capacitor according to an exemplary embodiment. Impedances as sampled values for frequencies shown by equation 1, which will be described later, are provided. (Step 11). Using frequency-independent resistance (R), capacitance (C), and inductance (L), one of an RC circuit consisting of the resistor and the capacitor, an RL circuit consisting of the resistor and the inductor, and an RCL circuit consisting of the RC circuit and the RL circuit connected in series is formed as an equivalent circuit model representing a circuit enabling a simulation in a time domain (step 12). An evaluation function defined by equation 3, described later, is set with equations 1 and 2 (step 13). A circuit constant vector is determined by minimizing equation 3 (step 14).

Figure 2A:
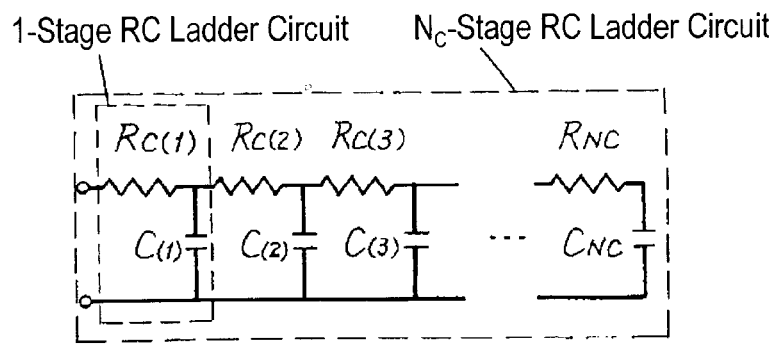
FIG. 2A is a diagram of an RC ladder circuit which is an equivalent circuit model of a capacitor according to the embodiments.
Figure 2B:
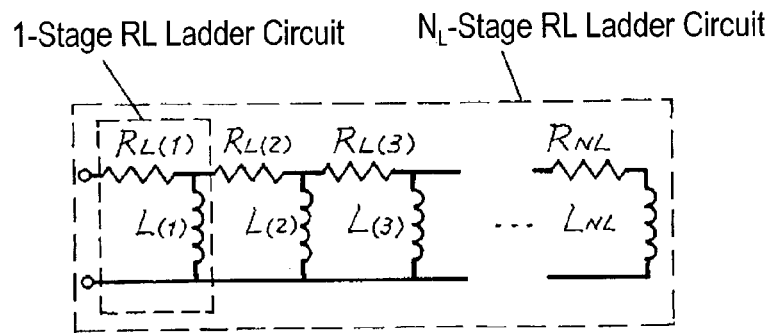
FIG. 2B is a diagram of an RL ladder circuit which is an equivalent circuit model of a capacitor according to the embodiments.
Figure 2C:
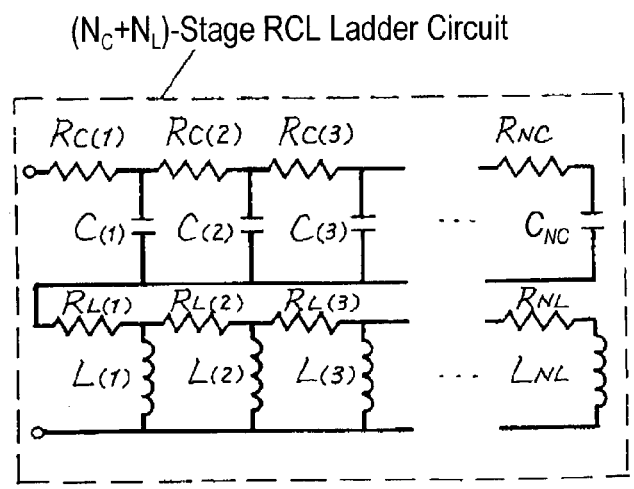
FIG. 2C is a diagram of an RCL ladder circuit which is an equivalent circuit model of a capacitor according to the exemplary embodiments.
Figure 3A:
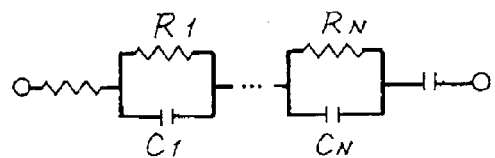
FIG. 3A through FIG. 3E are diagrams of RC circuits which are other equivalent circuit models of a capacitor.
Figure 3L:
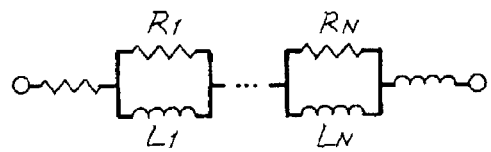
FIG. 3L through FIG. 3P are diagrams of RL circuits which are still other equivalent circuit models of a capacitor.
Figure 3B:
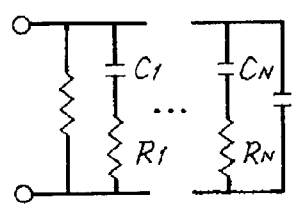
Figure 3M:
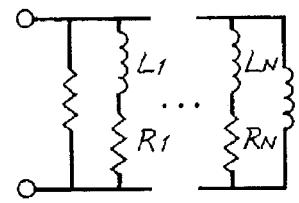
Figure 3C:
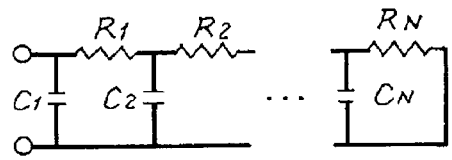
Figure 3N:
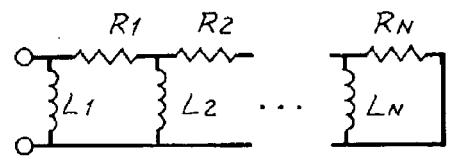
Figure 3D:
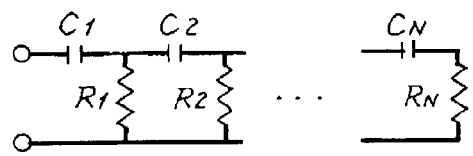
Figure 3O:
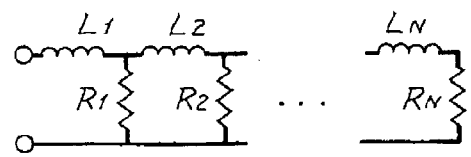
Figure 3E:
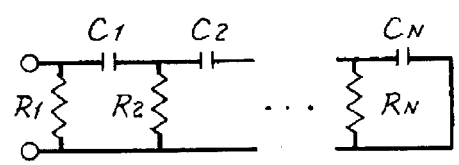
Figure 3P:
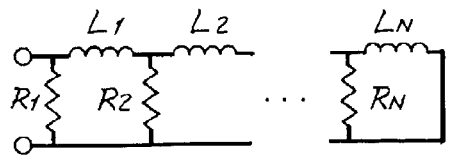

FIG. 2A through FIG. 2C show circuit diagrams of the equivalent circuit models of a capacitor according to the embodiment. FIG. 2A illustrates a single-stage RC ladder circuit having first resistance $R_C(1)$ and first capacitance $C(1)$ connected in series, a two-stage RC ladder circuit having a series circuit consisting of second resistance $R_C(2)$ and second capacitance $C(2)$ connected in parallel with the first capacitance $C(1)$, and an $N_C$-stage RC ladder circuit ("$N_C$" is a natural number) formed similarly. FIG. 2B illustrates a single-stage RL ladder circuit having first resistance $R_L(1)$ and first inductance $L(1)$ connected in series, a two-stage RL ladder circuit having a series circuit consisting of second resistance $R_L(2)$ and second inductance $L(2)$ connected in parallel with first inductance $L(1)$, and an $N_L$-stage RL ladder circuit ("$N_L$" is a natural number) formed similarly. FIG. 2C shows an $(N_C+N_L)$-stage RCL ladder circuit composed of the $N_C$-stage RC ladder circuit and the $N_L$-stage RL ladder circuit that are connected in series.

Besides those circuit diagrams shown in FIG. 2A through FIG. 2C, other diagrams are useful as long as constructing an equivalent circuit model of a capacitor, such as RC circuits shown in FIG. 3A through FIG. 3E, RL circuits shown in the FIG. 3L through FIG. 3P, and RCL circuits formed by connecting in series any of the RC circuits with any of the RL circuits (not shown in these figures). If using the diagrams, however, it is necessary to determine values of circuit components by another method suitable for each of the diagrams.

Figure 4:
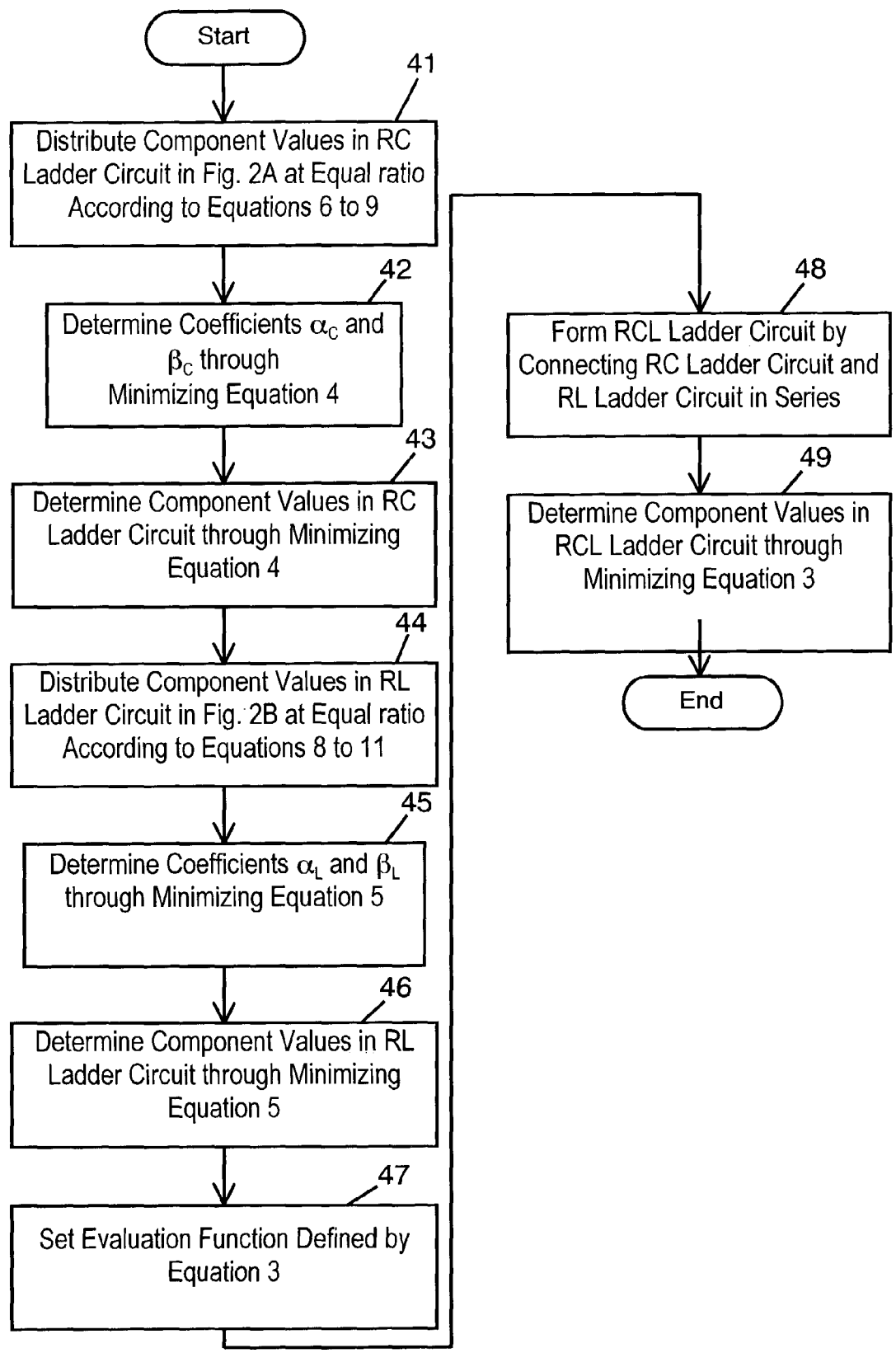
FIG. 4 is a flowchart showing a method of determining circuit constant vectors of the ladder circuits shown in FIG. 2A through FIG. 2C.

FIG. 4 is a flowchart showing a method of determining the circuit constant vector of any of the ladder circuits shown in FIG. 2A through FIG. 2C according to this exemplary embodiment. This corresponds to Step 14 of FIG. 1. In accordance with equations 6 through 9 discussed below, values of circuit components of the RC circuit in FIG. 2A through FIG. 2C are distributed at an equal ratio (step 41). A ratio for the equal-ratio distribution of the circuit component values is determined by minimizing equation 4 described later (step 42). A circuit constant vector is calculated by minimizing equation 4 using, as initial values, the circuit component values distributed at the ratio of equal-ratio distribution determined in step 42 (step 43). Values of circuit components of the RL circuit in one of FIG. 2A through FIG. 2C are distributed at an equal ratio in accordance with equations 8 through 11 discussed later (step 44). A ratio for the equal-ratio distribution of the circuit component values is determined by minimizing equation 5 described later (step 45). A circuit constant vector is calculated by minimizing equation 5, using, as initial values, the circuit component values distributed at the ratio of the equal-ratio distribution determined in the step 45 (step 46). Then, the evaluation function defined by the equation 3 is set (step 47). An RCL circuit is formed by connecting in series the RC circuit composed in step 41 through step 43 and the RL circuit composed in step 44 through step 46 (step 48). A circuit constant vector of the RCL circuit is determined by minimizing equation 3 (step 49).

For a tantalum solid electrolytic capacitor, a procedure for deriving a highly-accurate equivalent circuit model will be described hereinafter in detail with reference to FIG. 1.

For each of the sample frequencies, impedance Z ($f_n$) given by:

$$Z(f_n)=R(f_n)+jX(f_n) \qquad \text{(Equation 1)}$$

is provided. (step 11), where
  Z is the impedance of the capacitor,
  R is a real part of Z,
  X is an imaginary part of Z,
  $f_n$ is a sample frequency (n=1, 2, ... ,N), and
  j is the imaginary unit.

Using frequency-independent resistances (R), capacitances (C) and inductances (L), one of an RC circuit consisting of the resistance and the capacitance, an RL circuit consisting of the resistance and the inductance, and an RCL circuit consisting of the RC circuit and the RL circuit connected in series is formed as an equivalent circuit model representing the circuit enabling a simulation in a time domain. In this embodiment, 5 (five) is chosen for both numbers $N_C$ and $N_L$ representing the circuit diagrams shown in FIG. 2A through FIG. 2C, to form a ten-stage RCL ladder circuit by connecting in series a five-stage RC ladder circuit and a five-stage RL ladder circuit (step 12).

Impedance exhibited by the equivalent circuit model formed in step 12 is defined as:

$$Z_M(f_n, \vec{P}) = R_M(f_n, \vec{P}) + jX_M(f_n, \vec{P}) \quad \text{(Equation 2)},$$

where
$Z_M$ is the impedance of the equivalent circuit model,
$R_M$ is a real part of $Z_M$,
$X_M$ is an imaginary part of $Z_M$,
$f_n$ is the value of each sample frequency (n=1, 2, ...,N),
j is the imaginary unit, and
$\vec{P} = (P_1, P_2, \ldots P_K)$ is a circuit constant vector having elements as values of R, C and L, An evaluation function $Q(\vec{P})$ given by $$Q(\vec{P}) = \sum_{n=1}^{N} q(R_M(f_n, \vec{P}), X_M(f_n, \vec{P}), R(f_n), X(f_n)) \quad \text{(Equation 3)}$$

is composed (step 13). Here, $$q(R_M, X_M, R, X) = C_R \frac{|R_M - R|^2}{|R|^d} + C_X \frac{|X_M - X|^2}{|X|^d} + C_Z \frac{|Z_M - Z|^2}{|Z|^d}$$

where d is "0" for an evaluation of an absolute square error and is "2" for an evaluation of relative square error, and $C_R$, $C_X$, and $C_Z$ are "0" or any positive real numbers for assigning weights to respective terms.

When a real part $R(f_n)$ of given impedance becomes a minimum value $R_m$ at frequency $f_m$, instead of the ten-stage RCL ladder circuit as the equivalent circuit model, a combination of an $N_C$-stage RC ladder circuit and one resistor connected in series may be formed if m=N, or another combination of an $N_L$-stage RL ladder circuit and one resistor connected in series may be formed if m=1

In this embodiment, although 5 (five) was chosen for the numbers of stages, $N_C$ and $N_L$, this is not restrictive, and the numbers of stages, $N_C$ and $N_L$ may be different from each other. For the solid tantalum electrolytic capacitor, a condition of $N_C$=5 and $N_L$=5 provides the model with generally satisfying accuracy according to a result of changing the number of the stages and repeating derivation of the circuit model of this embodiment. Numbers $N_C$ and $N_L$ may be determined for other types of capacitors by repeating derivation in the same manner.

A procedure shown in FIG. 4 is applied for determining component values of the circuit in step 14. The procedure will be described hereafter according to FIG. 4.

Values of the circuit components for the five-stage RC ladder circuit are distributed at an equal ratio (step 41) in accordance with:

$$A(\vec{P}) = \sum_{n=1}^{N} a(R_M(f_n, \vec{P}), X_M(f_n, \vec{P}), R(f_n) - xR_0, X(f_n)), \quad \text{(Equation 6)}$$

where $0.5 \leq x \leq 1$, $$B(\vec{P}) = \sum_{n=1}^{N} b(R_M(f_n, \vec{P}), X_M(f_n, \vec{P}), R(f_n) - (1-x)R_0, X(f_n)), \quad \text{(Equation 7)}$$

where $0 \leq x \leq 1$, $$Rc(1) = (1-x)R_0, \sum_{k=1}^{N_c} C(k) = \frac{-1}{2\pi f_1 X(f_1)}, \quad \text{(Equation 8)}$$

and $$Rc(k+1) = \alpha_C \cdot Rc(k), \ C(k+1) = \beta_C \cdot C(k) \quad \text{(Equation 9)}.$$

Figure 5A:
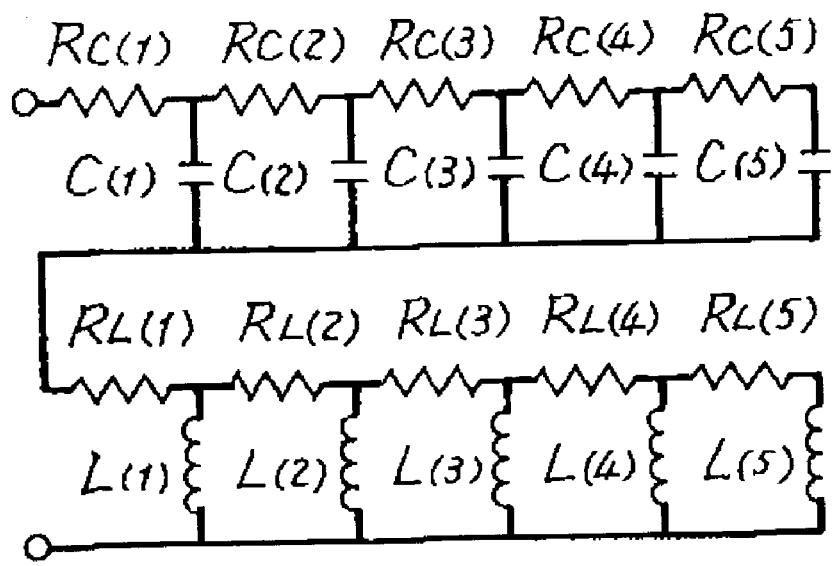
FIG. 5A shows an equivalent circuit model of a solid tantalum electrolytic capacitor according to the embodiments.
Figure 5B:
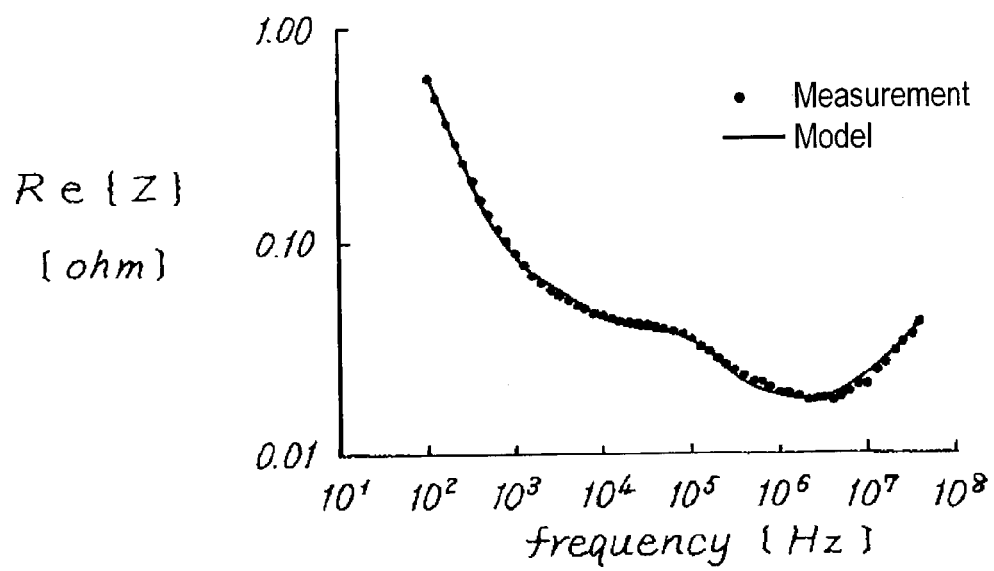
FIG. 5B is a graphical representation showing a real part of a reproduced impedance of the solid tantalum electrolytic capacitor according to the embodiments.
Figure 5C:
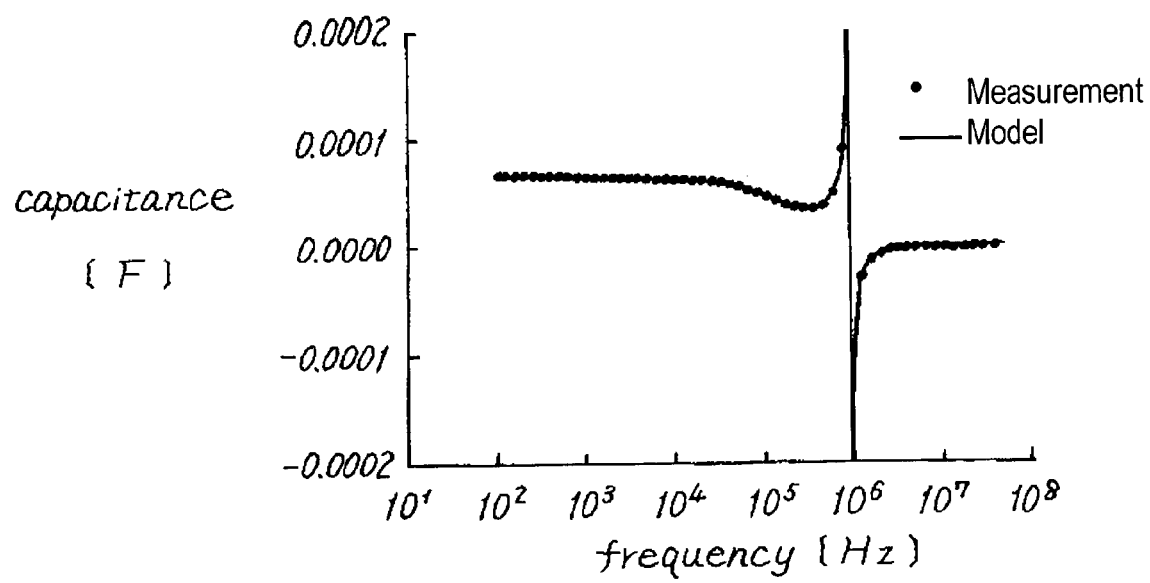
FIG. 5C is a graphical representation showing a reproduced capacitance of the solid tantalum electrolytic capacitor according to the embodiments.
Figure 6A:
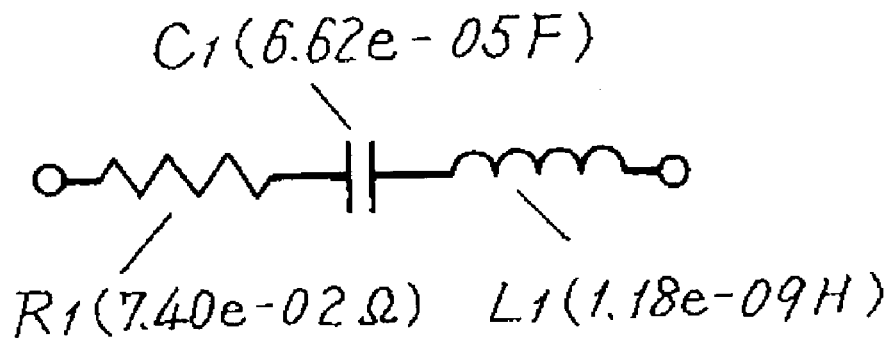
FIG. 6A shows a three-element model representing an equivalent circuit model of a solid tantalum electrolytic in a conventional method.
Figure 6B:
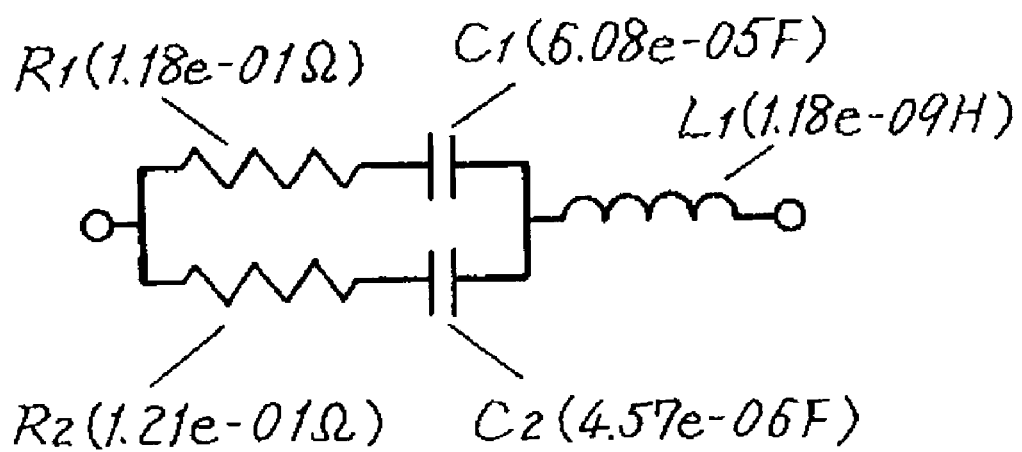
FIG. 6B shows a five-element model in a conventional method.
Figure 6C:
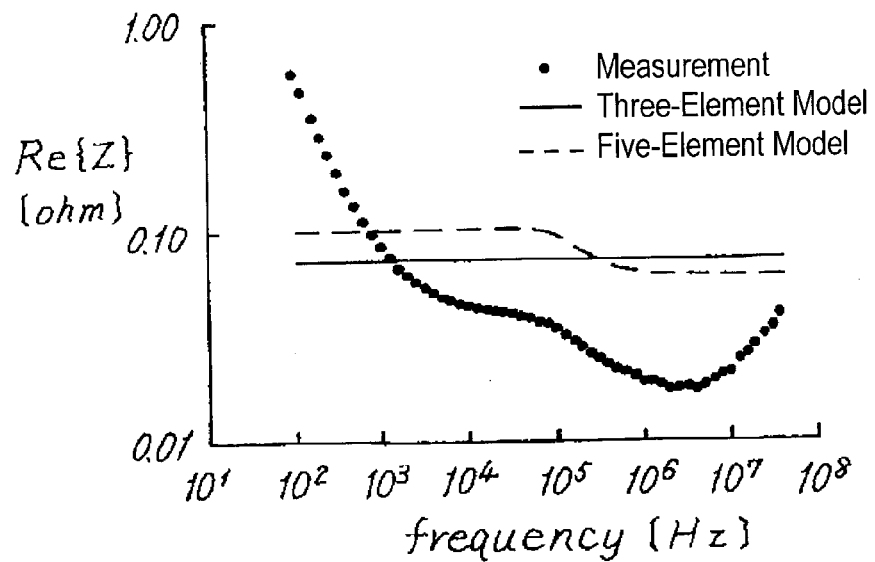
FIG. 6C is a graphical representation showing a real part of a reproduced impedance of the solid tantalum electrolytic capacitor by the conventional method.
Figure 6D:
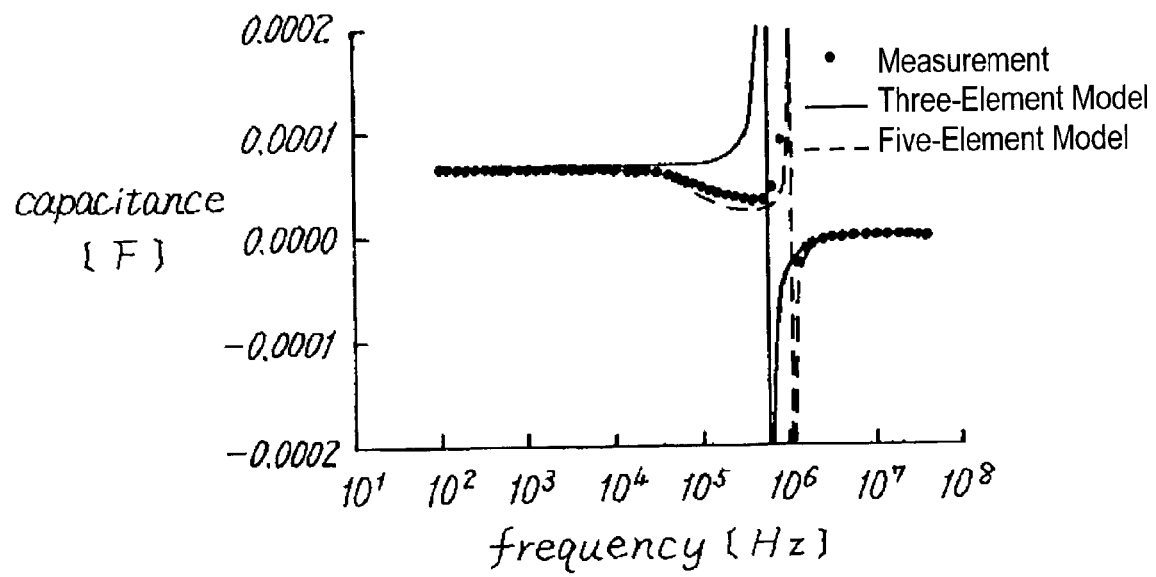
FIG. 6D is a graphical representation showing a reproduced capacitance of the solid tantalum electrolytic capacitor by the conventional method.

In other words, since the minimum value of the real part of impedance $R_0$ is 0.018 Ω, and since a capacitance in a low frequency region is 66.5 μF according to FIG. 5B and FIG. 5C, respectively, $$Rc(k+1) = \alpha_{C \cdot R_C}(k), \ C(k+1) = \beta_{C \cdot C}(k) \quad \text{(Equation 9)}$$

stand applicable for k=1, 2, 3 and 4 when x=½, under the conditions of $$Rc(1) = \frac{0.018 \times 10^{-3}}{2}, \sum_{k=1}^{5} C(k) = 66.5 \times 10^6.$$

Coefficients $\alpha_C$ and $\beta_C$ are obtained by minimizing evaluation function $A(\vec{P})$ set in the step 13, as $\alpha_C$=20.6, and $\beta_C$=0.37 (step 42).

Values of the circuit components are determined by minimizing the evaluation function $A(\vec{P})$ set in third step 13 from initial values of the component values given by the coefficients $\alpha_C$ and $\beta_C$ obtained in the step 42 (step 43). Table 1 shows the determined circuit component values.

TABLE 1

| | |
|---|---|
| Rc(1) = 1.12 × 10$^{-02}$ | C(1) = 2.29 × 10$^{-05}$ |
| Rc(2) = 8.75 × 10$^{-02}$ | C(2) = 3.12 × 10$^{-05}$ |
| Rc(3) = 3.89 × 10$^{+00}$ | C(3) = 4091 × 10$^{-17}$ |
| Rc(4) = 8.03 × 10$^{+01}$ | C(4) = 2.71 × 10$^{-06}$ |
| Rc(5) = 1.67 × 10$^{+03}$ | C(5) = 3.10 × 10$^{-06}$ |

Values shown are in Ω for $R_C$(k), and F for C(k).

Values of the circuit components for the five-stage RL ladder circuit are distributed at an equal ratio (step 44) in accordance with equations 8 and 9 and the following equations:

$$R_L(1) = x \cdot R_0, \ L(1) = \frac{X(f_N)}{2\pi f_N}; \quad \text{(Equation 10)}$$

and $$R_L(k+1) = \alpha_L \cdot R_L(K), \ L(k+1) = \beta_L \cdot L(k) \quad \text{(Equation 11)}.$$

In other words, since the minimum value of the real part of impedance $R_0$ is 0.018 Ω, and since a capacitance in a high frequency region is 1.14 nH according to FIG. 5B and FIG. 5C, respectively, the following equations $$R_L(1) = \frac{0.018 \times 10^{-3}}{2}, \text{ and}$$

$$L(1) = 1.14 \times 10^{-9}$$

are applicable for k=1, 2, 3 and 4 when x=½, under the conditions of $$R_L(k+1) = \alpha_L \cdot R_L(K), \quad L(k+1) = \beta_L \cdot L(k) \quad \text{(Equation 11)}$$

Coefficients $\alpha_L$ and $\beta_L$ are obtained by minimizing evaluation function $B(\vec{P})$ set in step 13, as $\alpha_L$=15.7, and $\beta_L$=3.47 (step 45).

In 4f-th step 46, values of the circuit components are determined by minimizing evaluation function $B(\vec{P})$ set in step 13 from initial values of the component values given by coefficients $\alpha_L$ and $\beta_L$ obtained in 4e-th step 45. The circuit component values are shown in Table 2.

TABLE 2

| | |
|---|---|
| $R_L(1) = 6.13 \times 10^{-03}$ | $L(1) = 1.57 \times 10^{-09}$ |
| $R_L(2) = 1.60 \times 10^{-01}$ | $L(2) = 7.24 \times 10^{-09}$ |
| $R_L(3) = 2.18 \times 10^{+00}$ | $L(3) = 9.93 \times 10^{-09}$ |
| $R_L(4) = 3.41 \times 10^{+01}$ | $L(4) = 2.19 \times 10^{-06}$ |
| $R_L(5) = 5.35 \times 10^{+02}$ | $L(5) = 7.15 \times 10^{-16}$ |

Values shown are in Ω for $R_L(k)$, and H for $L(k)$.

The estimation function $Q(\vec{P})$ defined by equation 3 (step 47). That is, $$Q(\vec{P}) = \sum_{n=1}^{m} q(R_M(f_n, \vec{P}), X_M(f_n, \vec{P}), R(f_n) - R_0/2, X(f_n)), \text{ and}$$

$$q(R_M, X_M, R, X) = c_R \frac{|R_M - (R - R_0/2)|^2}{|R|^d} + c_X \frac{|X_M - X|^2}{|X|^d} + c_Z \frac{|Z_M - Z|^2}{|Z|^d},$$

where $C_X \ll C_Z \ll C_R$, in order to assign a greater weight to a relative square error of the real part, since accuracy of the real part of impedance is not easily assured.

A ten-stage RCL ladder circuit is formed by connecting in series the five-stage RC ladder circuit composed in step 41 through step 43 and the five-stage RL ladder circuit composed in step 44 through step 46 (step 48).

Values of circuit components of the ten-stage RCL ladder circuit formed in step 48 are determined by minimizing evaluation function $Q(\vec{P})$ set in step 47 (step 49). Table 3 shows the determined circuit component values.

TABLE 3

| | |
|---|---|
| $R_C(1) = 1.24 \times 10^{-02}$ | $C(1) = 2.25 \times 10^{-05}$ |
| $R_C(2) = 6.00 \times 10^{-02}$ | $C(2) = 3.85 \times 10^{-05}$ |
| $R_C(3) = 3.90 \times 10^{+00}$ | $C(3) = 2.07 \times 10^{-17}$ |
| $R_C(4) = 8.04 \times 10^{+01}$ | $C(4) = 2.79 \times 10^{-06}$ |
| $R_C(5) = 1.67 \times 10^{+03}$ | $C(5) = 4.49 \times 10^{-06}$ |
| $R_L(1) = 5.24 \times 10^{-03}$ | $L(1) = 1.24 \times 10^{-09}$ |
| $R_L(2) = 2.66 \times 10^{-01}$ | $L(2) = 9.59 \times 10^{-09}$ |
| $R_L(3) = 2.18 \times 10^{+00}$ | $L(3) = 4.51 \times 10^{-09}$ |
| $R_L(4) = 3.41 \times 10^{+01}$ | $L(4) = 3.68 \times 10^{-06}$ |
| $R_L(1) = 5.35 \times 10^{+02}$ | $L(5) = 4.65 \times 10^{-16}$ |

Values shown are in Ω for $R_C(k)$ and $R_L(k)$, F for $C(k)$, and H for $L(k)$.

The equivalent circuit model derived as above, a result of reproduction of the real parts of impedance, and a result of reproduction of the capacitances are shown in FIG. 5A, FIG. 5B, and FIG. 5C, respectively. With the equivalent circuit model, an accuracy including a relative error less than 10% is ensured in reproduction of impedances across all points of the sampling frequencies.

Exemplary Embodiment 2

In a method of deriving an equivalent circuit model of exemplary embodiment 2, an RCL circuit is formed as an equivalent circuit model wherein the real part $R(f_n)$ of impedance becomes minimum value $R_0$ at sample frequency $f_m (f_m \neq f_1 \text{ and } f_m \neq f_n)$, in step 12 of exemplary embodiment 1, and evaluation function in a low frequency region $f_{m+1} \leq f_n \leq f_m$ is calculated according to:

$$A(\vec{P}) = \sum_{n=1}^{N} a(R_M(f_n, \vec{P}), X_M(f_n, \vec{P}), R(f_n) - xR_0, X(f_n)) \quad \text{(Equation 4)}$$

where ($0 \leq x \leq 1$), instead of the evaluation function defined by equation 3 in step 13. Further, factors x and d are set as x=½ and d=2 in calculation of evaluation function in a high frequency region $f_{m+1} \leq f_n \leq f_N$ according to $$B(\vec{P}) = \sum_{n=1}^{N} b(R_M(f_n, \vec{P}), X_M(f_n, \vec{P}), R(f_n) - (1-x)R_0, X(f_n)) \quad \text{(Equation 5)}$$

where $0 \leq x \leq 1$. That is, $$A(\vec{P}) = \sum_{n=1}^{m} a(R_M(f_n, \vec{P}), X_M(f_n, \vec{P}), R(f_n) - R_0/2, X(f_n)),$$

$$a(R_M, X_M, R, X) = c_R \frac{|R_M - (R - R_0/2)|^2}{|R|^d} + c_X \frac{|X_M - X|^2}{|X|^d} + c_Z \frac{|Z_M - Z|^2}{|Z|^d},$$

$$B(\vec{P}) = \sum_{n=m+1}^{N} b(R_M(f_n, \vec{P}), X_M(f_n, \vec{P}), R(f_n) - R_0/2, X(f_n)), \text{ and}$$

$$b(R_M, X_M, R, X) = c_R \frac{|R_M - (R - R_0/2)|^2}{|R|^d} + c_X \frac{|X_M - X|^2}{|X|^d} + c_Z \frac{|Z_M - Z|^2}{|Z|^d},$$

where $C_X \ll C_Z \ll C_R$, in order to assign a greater weight to a relative square error of the real part, since it is considerably difficult to ensure accuracy of the real part of impedance.

Exemplary Embodiment 3

An RC circuit is formed as an equivalent circuit model in which a real part $R(f_n)$ of impedance becomes minimum value $R_0$ at sample frequency of $f_m$ ($f_m = f_N$) in step 12 of embodiment 1, and an evaluation function in an entire frequency region $f_1 \leq f_n \leq f_N$ is calculated according to:

$$A(\vec{P}) = \sum_{n=1}^{N} a\left(R_M(f_n, \vec{P}), X_M(f_n, \vec{P}), R(f_n) - xR_0, X(f_n)\right) \quad \text{(Equation 6a)}$$

where $0 \leq x \leq 1$, instead of the evaluation function in step 13. A new RC circuit is then completed by connecting additionally a resistance $xR_0$ in series to the above RC circuit.

Exemplary Embodiment 4

An RL circuit is formed as an equivalent circuit model in which a real part $R(f_n)$ of impedance becomes minimum value $R_0$ at sample frequency of $f_m(f_m = f_N)$, in step 12 of embodiment 1, and an evaluation function in an entire frequency region $f_1 \leq f_n \leq f_N$ is calculated according to:

$$B(\vec{P}) = \sum_{n=1}^{N} b\left(R_M(f_n, \vec{P}), X_M(f_n, \vec{P}), R(f_n) - (1-x)R_0, X(f_n)\right) \quad \text{(Equation 7a)}$$

where $0 \leq x \leq 1$, instead of the evaluation function in third step, and further, a new RL circuit is completed by connecting additionally a resistance $(1-x)R_0$ in series to the above RL circuit.

Exemplary Embodiment 5

In addition to embodiment 2, in this embodiment, evaluation function $A(\vec{P})$ is minimized in any of a single-stage RC ladder circuit having a first resistance and a first capacitance connected in series, a two-stage RC ladder circuit having a series circuit consisting of a second resistance and a second capacitance connected in parallel with the first capacitance, and an Nc-stage RC ladder circuit ("$N_C$" is a natural number) formed in the same manner, and evaluation function $B(\vec{P})$ is minimized in any of a single-stage RL ladder circuit having a first resistance and a first inductance connected in series, a two-stage RL ladder circuit having a series circuit consisting of a second resistance and a second inductance connected in parallel with the first inductance, and an $N_L$-stage RL ladder circuit ("$N_L$" is a natural number) formed in the same manner.

Exemplary Embodiment 6

In addition to embodiment 3, in this embodiment, evaluation function $A(\vec{P})$ in any of a single-stage RC ladder circuit having a first resistance and a first capacitance connected in series, a two-stage RC ladder circuit having a series circuit consisting of a second resistance and a second capacitance connected in parallel with the first capacitance, and an $N_C$-stage RC ladder circuit ("$N_C$" is a natural number) formed in the same manner.

Exemplary Embodiment 7

In addition to embodiment 4, in this embodiment, evaluation function $B(\vec{P})$ is minimized in any of a single-stage RL ladder circuit having a first resistance and a first inductance connected in series, a two-stage RL ladder circuit having a series circuit consisting of a second resistance and a second inductance connected in parallel with the first inductance, and an $N_L$-stage RL ladder circuit ("$N_L$" is a natural number) formed in the same manner.

The foregoing embodiments can be implemented in combination, and a number of stages in the RC ladder circuit and the RL ladder circuit can be set freely as desired.

Although methods of deriving the equivalent circuit models for capacitors are explained, a simulator for deriving an equivalent circuit model according to these methods can be conducted. Furthermore, another simulator for analyzing frequency response and/or time response of a circuit with using the equivalent circuit model for capacitors can be conducted.

In addition, a computer-readable recording medium storing a program containing the function of deriving an equivalent circuit model based on these methods of deriving equivalent circuit model can be provided. Moreover, another computer-readable recording medium storing a program containing the function of analyzing frequency response and/or time response of a circuit in the similar manner with using the equivalent circuit model for capacitors can be provided.

INDUSTRIAL APPLICABILITY

By a method of deriving an equivalent circuit model for capacitors according to the present invention and a circuit simulation using the equivalent circuit model realize accurate prediction for operation of a circuit including capacitors. This improves efficiency of designing electronic circuits. In addition, the method of the invention is applicable not only to the capacitors but also to other passive components, such as resistors and inductors.

The invention claimed is:

1. A method of determining an equivalent circuit model of a passive element, said method comprising the steps of:
    (a) providing the equivalent circuit model using an RCL circuit comprising an RC circuit and an RL circuit connected in series to the RC circuit, the RC circuit comprising a resistor and a capacitor, the RL circuit comprising a resistor and an inductor;
    (b) inputting a measured impedance of the passive element over a frequency range ($f_1, \ldots, f_N$), the measured impedance including a measured real impedance R, a measured imaginary impedance X, and a measured complex impedance Z, the measured real impedance having a minimum value $R_0$ at a frequency $f_m$, (where $f_m \neq f_1$ and $f_m \neq f_N$);
    (c) calculating an estimated impedance over the frequency range, the estimated impedance including an estimated real impedance $R_M$, an estimated imaginary impedance $X_M$ and an estimated complex impedance $Z_M$ using values for circuit elements of the equivalent circuit model provided in step (a);
    (d) determining first and second evaluation functions over respective first and second sub-frequency ranges within the frequency range, the first frequency sub-range including frequencies $f_1 \leq f_n \leq f_m$, the second frequency sub-range including frequencies $f_{m+1} \leq f_n \leq f_N$, each of the first and the second evaluation functions determining an error between the estimated impedance and the measured impedance by calculating a difference between each of 1) the estimated real impedance $R_M$ and the measured real impedance R subtracted by the minimum value $R_0$, 2) the estimated imaginary impedance $X_M$ and the measured imaginary impedance X and 3) the estimated complex impedance $Z_M$ and the measured complex impedance Z, the first evaluation function comprising:

$$A(\vec{P}) = \sum_{n=1}^{m} a(R_M(f_n), \vec{P}), X_M(f_n, \vec{P}), R(f_n) - xR_0, X(f_n)),$$

where $$a(R_M, X_M, R, X) = c_R \frac{|R_M - (R - R_0/2)|^2}{|R|^d} + c_X \frac{|X_M - X|^2}{|X|^d} + c_Z \frac{|Z_M - Z|^2}{|Z|^d},$$

the second evaluation function comprising:

$$B(\vec{P}) = \sum_{n=m+1}^{N} b(R_M(f_n, \vec{P}), X_M(f_n, \vec{P}), R(f_n) - (1-x)R_0, X(f_n)),$$

where $$b(R_M, X_M, R, X) = c_R \frac{|R_M - (R - (1-x)R_0)|^2}{|R|^d} + c_x \frac{|X_M - X|^2}{|X|^d} + c_z \frac{|Z_M - Z|^2}{|Z|^d},$$

and, for each of the first and the second evaluation functions, where $0 \leq x \leq 1$, $\vec{P} = (P_1, P_2, \ldots P_K)$ is a circuit constant vector storing the values of the circuit elements and d, $C_R$, $C_X$, and $C_Z$ are positive real numbers or zero;
(e) applying the estimated impedance calculated in step (c) and the measured impedance inputted in step (b) to the first and the second evaluation functions determined in step (d);
(f) adjusting values of the estimated impedance to minimize the error between the estimated impedance and the measured impedance using the first evaluation function, thereby generating a part of element values of the equivalent circuit model of the passive element;
(g) adjusting the values of the estimated impedance to minimize the error between the estimated impedance and the measured impedance using the second evaluation function, thereby generating a further part of the element values of the equivalent circuit model of the passive element; and
(h) storing the part of the element values and the further part of the element values.

2. The computer implemented method according to claim 1, wherein the equivalent circuit model includes an $N_C$-stage RC ladder circuit and an $N_L$-stage RL ladder circuit connected in series with each other.

3. The method according to claim 2, wherein said step (f) of adjusting the values of the estimated impedance comprises the sub-steps of:
(f-1) distributing a resistance $R_C(k)$ and a capacitance $C(k)$ in a k-th stage of the $N_C$-stage RC ladder circuit at an equal ratio with coefficients $\alpha_C$ and $\beta_C$ in accordance with formulae $$Rc(k+1) = \alpha_C \cdot Rc(k), \text{ and } C(k+1) = \beta_C \cdot C(k),$$

under conditions of $$Rc(1) = (1-x)R_0, \text{ and } \sum_{k=1}^{Nc} C(k) = \frac{-1}{2\pi f_1 X(f_1)};$$

(f-2) obtaining the coefficients $\alpha_C$ and $\beta_C$ by minimizing the first evaluation function $A(\vec{P})$ using values given in said step (f-1) as initial values; and
(f-3) obtaining the resistance $R_C(k)$ and the capacitance $C(k)$ by minimizing the first evaluation function $A(\vec{P})$ using values derived from the coefficients $\alpha_C$ and $\beta_C$ obtained in said step (f-2) as initial values, and
wherein said step (g) of adjusting the values of the estimated impedance comprises the sub-steps of:
(g-1) distributing a resistance $R_L(k)$ and an inductance $L(k)$ in a k-th stage of the $N_L$-stage RL ladder circuit at an equal ratio with coefficients $\alpha_L$ and $\beta_L$ in accordance with formulae $$R_L(k+1) = \alpha_L \cdot R_L(K), \text{ and } L(k+1) = \beta_L \cdot L(k),$$

under conditions of $$R_L(1) = x \cdot R_0, \text{ and } L(1) = \frac{X(f_N)}{2\pi f_N};$$

(g-2) obtaining the coefficients $\alpha_L$ and $\beta_L$ by minimizing the second evaluation function $B(\vec{P})$ using values given in said step (g-1) as initial values; and
(g-3) obtaining the resistance $R_L(k)$ and the inductance $L(k)$ by minimizing the second evaluation function $B(\vec{P})$ using, as initial values, values derived from the coefficients $\alpha_L$ and $\beta_L$ obtained in said step (g-2).

4. The method according to claim 3 further comprising the steps of:
(i) calculating a further estimated impedance over the frequency range by forming an RCL ladder circuit, the RCL ladder circuit formed by connecting, in series, the RC ladder circuit obtained in steps (f-1) through (f-3) and the RL ladder circuit obtained in said steps (g-1) through (g-3) using values for the circuit elements of the RCL ladder circuit; and
(j) determining a third evaluation function $Q(\vec{P})$ over the frequency range, the third evaluation function determining a further error between the further estimated impedance and the measured impedance,
the third evaluation function comprising:

$$Q(\vec{P}) = \sum_{n=1}^{N} q(R_M(f_n, \vec{P}), X_M(f_n, \vec{P}), R(f_n), X(f_n)) \text{ where}$$

-continued $$q(R_M, X_M, R, X) = C_R \frac{|R_M - R|^2}{|R|^d} + C_X \frac{|X_M - X|^2}{|X|^d} + C_Z \frac{|Z_M - Z|^2}{|Z|^d};$$

and (k) determining the resistance $R_C(k)$, the capacitance $C(k)$, the resistance $R_L(k)$, and the inductance $L(k)$ by adjusting the values of the further estimated impedance to minimize the further error between the further estimated impedance and the measured impedance using the third evaluation function $Q(\vec{P})$, using the resistance $R_C(k)$ and the capacitance $C(k)$ obtained in said step (f-3) and the resistance $R_L(k)$ and the inductance $L(k)$ obtained in said step (g-3) as initial values.

5. A method of determining an equivalent circuit model of a passive element, comprising the steps of:

(a) inputting a measured impedance of the passive element over a frequency range $(f_1, \ldots, f_N)$, the measured impedance including a measured real impedance R, a measured imaginary impedance X, and a measured complex impedance Z, the measured real impedance having a minimum value $R_0$ at a frequency $f_m$, (where $f_m \neq f_N$);

(b) providing a first RC circuit including a resistance and a capacitance as the equivalent circuit model;

(c) calculating an estimated impedance over the frequency range, the estimated impedance including an estimated real impedance $R_M$, an estimated imaginary impedance $X_M$, and an estimated complex impedance $Z_M$ using values for circuit elements of the equivalent circuit model provided in step (b);

(d) determining an evaluation function over the frequency range, the evaluation function determining an error between the estimated impedance and the measured impedance by calculating a difference between each of 1) the estimated real impedance $R_M$ and the measured real impedance R subtracted by the minimum value $R_0$, 2) the estimated imaginary impedance $X_M$ and the measured imaginary impedance X and 3) the estimated complex impedance $Z_M$ and the measured complex impedance Z, the evaluation function comprising:

$$A(\vec{P}) = \sum_{n=1}^{N} a(R_M(f_n, \vec{P}), X_M(f_n, \vec{P}), R(f_n) - xR_0, X(f_n)),$$

where $$a(R_M, X_M, R, X) =$$

$$C_R \frac{|R_M - (R - xR_0)|^2}{|R|^d} + C_X \frac{|X_M - X|^2}{|X|^d} + C_Z \frac{|Z_M - Z|^2}{|Z|^d},$$

where $0 \leq x \leq 1$, $P = (P_1, P_2, \ldots P_K)$ is a circuit constant vector storing the values of the circuit elements and d, $C_R$, $C_X$, and $C_Z$ are positive real numbers or zero;

(e) applying the estimated impedance calculated in step (c) and the measured impedance inputted in step (a) to the evaluation function determined in step (d);

(f) adjusting values of the estimated impedance to minimize the error between the estimated impedance and the measured impedance using the evaluation function, thereby generating element values of the equivalent circuit model of the passive element;

(g) providing a second RC circuit including the first RC circuit having the element values generated in step (f) and a resistance $xR_0$ connected in series with the first RC circuit; and (h) storing the element values.

6. The computer implemented method according to claim 5, wherein the first RC circuit includes an $N_C$-stage RC ladder circuit ("$N_C$" is a natural number) having a resistance arranged in a serial arm and a capacitance arranged in a parallel arm.

7. The method according to claim 6, wherein said step (f) of adjusting the values of the estimated impedance comprises the sub-steps of:

(f-1) distributing a resistance $R_C(k)$ and a capacitance $C(k)$ in a k-th stage of the $N_C$-stage RC ladder circuit at an equal ratio with coefficients $\alpha_C$ and $\beta_C$ in accordance with formulae $$Rc(k+1) = \alpha_C \cdot R_C(k), \text{ and } C(k+1) = \beta_C \cdot C(k),$$

under conditions of $$Rc(1) = (1-x)R_0, \text{ and } \sum_{k=1}^{N_C} C(k) = \frac{-1}{2\pi f_1 X(f_1)};$$

(f-2) obtaining the coefficients $\alpha_C$ and $\beta_C$ by minimizing the evaluation function $A(\vec{P})$ using the values given in said step (f-1) as initial values; and (f-3) obtaining the resistance $R_C(k)$ and the capacitance $C(k)$ by minimizing the evaluation function $A(\vec{P})$ using values derived from the coefficients $\alpha_C$ and $\beta_C$ obtained in said step (f-2) as initial values.

8. A method of determining an equivalent circuit model of a passive element, comprising the steps of:

(a) inputting a measured impedance of the passive element over a frequency range $(f_1, \ldots, f_N)$, the measured impedance including a measured real impedance R, a measured imaginary impedance X, and a measured complex impedance Z, the measured real impedance having a minimum value $R_0$ at a frequency $f_m$, (where $f_m \neq f_N$);

(b) providing a first RL circuit including a resistance and an inductance as the equivalent circuit model;

(c) calculating an estimated impedance over the frequency range, the estimated impedance including an estimated real impedance $R_M$, an estimated imaginary impedance $X_M$, and an estimated complex impedance $Z_M$ using values for circuit elements of the equivalent circuit model provided in step (b);

(d) determining an evaluation function over the frequency range, the evaluation function determining an error between the estimated impedance and the measured impedance by calculating a difference between each of 1) the estimated real impedance $R_M$ and the measured real impedance R subtracted by the minimum value $R_0$, 2) the estimated imaginary impedance $X_M$ and the measured imaginary impedance X and 3) the estimated complex impedance $Z_M$ and the measured complex impedance Z, the evaluation function comprising:

$$B(\vec{P}) = \sum_{n=1}^{N} b(R_M(f_n, \vec{P}), X_M(f_n, \vec{P}), R(f_n) - (1-x)R_0, X(f_n)),$$

where $$b(R_M, X_M, R, X) =$$
$$c_R \frac{|R_M - (R-(1-x)R_0)|^2}{|R|^d} + c_X \frac{|X_M - X|^2}{|X|^d} + c_Z \frac{|Z_M - Z|^2}{|Z|^d},$$

where $0 \leq x \leq 1$, $\vec{P} = (P_1, P_2, \ldots P_K)$ is a circuit constant vector storing the values of the circuit elements, and d, $C_R$, $C_X$, and $C_Z$ are positive real numbers or zero;

(e) applying the estimated impedance calculated in step (c) and the measured impedance inputted in step (a) to the evaluation function determined in step (d);

(f) adjusting values of the estimated impedance to minimize the error between the estimated impedance and the measured impedance using the evaluation function, thereby generating element values of the equivalent circuit model of the passive element;

(g) providing a second RL circuit by connecting the first RL circuit having the element values generated in step (f) in series with a resistance $(1-x)R_0$; and (h) storing the element values.

9. The computer implemented method according to claim 8, wherein the first RL circuit includes an $N_L$-stage RL ladder circuit ("$N_L$" is a natural number) having a resistance arranged in a serial arm and an inductance arranged in a parallel arm.

10. The method according to claim 9, wherein said step (f) of adjusting the values of the estimated impedance comprises the sub-steps of:

(f-1) distributing a resistance $R_L(k)$ and an inductance $L(k)$ in a k-th stage of the $N_L$-stage RL ladder circuit at an equal ratio with coefficients $\alpha_L$ and $\beta_L$ in accordance with formulae $$RL(k+1) = \alpha_L \cdot R_L(K), \text{ and } L(k+1) = \beta_L \cdot L(k),$$

under conditions of $$R_L(1) = x \cdot R_0, \text{ and } L(1) = \frac{X(f_N)}{2\pi f_N};$$

(f-2) obtaining the coefficients $\alpha_L$ and $\beta_L$ by minimizing the evaluation function $B(\vec{P})$ using values given in said step (f-1) as initial values; and (f-3) obtaining the resistance $R_L(k)$ and the inductance $L(k)$ by minimizing the evaluation function $B(\vec{P})$ using values derived from the coefficients $\alpha_L$ and $\beta_L$ obtained in said step (f-2) as initial values.

11. A recording medium readable by a computer, said recording medium storing a program For allowing the computer to execute a method of determining an equivalent circuit model of a passive element, wherein said method comprises the steps of:

(a) providing the equivalent circuit model using an RCL circuit comprising an RC circuit and an RL circuit connected in series to the RC circuit, the RC circuit comprising a resistor and a capacitor, the RL circuit comprising a resistor and an inductor;

(b) inputting a measured impedance of the passive element over a frequency range ($f_1, \ldots, f_N$), the measured impedance including a measured real impedance R, a measured imaginary impedance X, and a measured complex impedance Z, the measured real impedance having a minimum value $R_0$ at a frequency $f_m$, (where $f_m \neq f_1$ and $f_m \neq f_N$);

(c) calculating an estimated impedance over the frequency range, the estimated impedance including an estimated real impedance $R_M$, an estimated imaginary impedance $X_M$, and an estimated complex impedance $Z_M$ using values for circuit elements of the equivalent circuit model provided in step (a);

(d) determining first and second evaluation functions over respective first and second sub-frequency ranges within the frequency range, the first frequency sub-range including frequencies $f_1 \leq f_n \leq f_m$, the second frequency sub-range including frequencies $f_{m+1} \leq f_n \leq f_N$, each of the first and the second evaluation functions determining an error between the estimated impedance and the measured impedance by calculating a difference between each of 1) the estimated real impedance $R_M$ and the measured real impedance R subtracted by the minimum value $R_0$, 2) the estimated imaginary impedance $X_M$ and the measured imaginary impedance X and 3) the estimated complex impedance $Z_M$ and the measured complex impedance Z, the first evaluation function comprising:

$$A(\vec{P}) = \sum_{n=1}^{m} a(R_M(f_n, \vec{P}), X_M(f_n, \vec{P}), R(f_n) - xR_0, X(f_n)),$$

where $$a(R_M, X_M, R, X) = c_R \frac{|R_M - (R-xR_0)|^2}{|R|^d} + c_X \frac{|X_M - X|^2}{|X|^d} + c_Z \frac{|Z_M - Z|^2}{|Z|^d},$$

the second evaluation function comprising:

$$B(\vec{P}) = \sum_{n=m+1}^{N} b(R_M(f_n, \vec{P}), X_M(f_n, \vec{P}), R(f_n) - (1-x)R_0, X(f_n)),$$

where $$b(R_M, X_M, R, X) =$$
$$c_R \frac{|R_M - (R-(1-x)R_0)|^2}{|R|^d} + c_X \frac{|X_M - X|^2}{|X|^d} + c_Z \frac{|Z_M - Z|^2}{|Z|^d},$$

and, for each of the first and the second evaluation functions, where $0 \leq x \leq 1$, $\vec{P} = (P_1, P_2, \ldots P_K)$ is a circuit constant vector storing the values of the circuit elements and d, $C_R$, $C_X$, and $C_Z$ are positive real numbers or zero;

(e) applying the estimated impedance calculated in step (c) and the measured impedance inputted in step (b) to the first and the second evaluation functions determined in step (d);
(f) adjusting values of the estimated impedance to minimize the error between the estimated impedance and the measured impedance using the first evaluation function, thereby generating a part of element values of the equivalent circuit model of the passive element;
(g) adjusting the values of the estimated impedance to minimize the error between the estimated impedance and the measured impedance using the second evaluation function, thereby generating a further part of the element values of the equivalent circuit model of the passive element; and
(h) storing the part of the element values and the further part of the element values.

12. A computer implemented method of determining an equivalent circuit model of a passive element, said method comprising the steps of:
(a) providing the equivalent circuit model using an RCL circuit comprising an RC circuit and an RL circuit connected in series to the RC circuit, the RC circuit comprising a resistor and a capacitor, the RL circuit comprising a resistor and an inductor;
(b) inputting a measured impedance of the passive element over a frequency range $(f_1, \ldots, f_N)$, the measured impedance including a measured real impedance R, a measured imaginary impedance X, and a measured complex impedance Z, the measured real impedance having a minimum value $R_0$ at a frequency $f_m$, (where $f_m \neq f_1$ and $f_m \neq f_N$);
(c) calculating an estimated impedance over the frequency range, the estimated impedance including an estimated real impedance $R_M$, an estimated imaginary impedance $X_M$ and an estimated complex impedance $Z_M$ using values for circuit elements of the equivalent circuit model provided in step (a);
(d) determining first and second evaluation functions over respective first and second sub-frequency ranges within the frequency range, the first frequency sub-range including frequencies $f_1 \neq f_n \leq F_m$, the second frequency sub-range including frequencies $f_{m+1} \leq f_n \leq f_N$, each of the first and the second evaluation functions determining an error between the estimated impedance and the measured impedance by calculating a difference between each of 1) the estimated real impedance $R_M$ and the measured real impedance R subtracted by the minimum value $R_0$, 2) the estimated imaginary impedance $X_M$ and the measured imaginary impedance X and 3) the estimated complex impedance $Z_M$ and the measured complex impedance Z, the first evaluation function comprising:

$$A(\vec{P}) = \sum_{n=1}^{m} a(R_M(f_n, \vec{P}), X_M(f_n, \vec{P}), R(f_n) - xR_0, X(f_n)),$$

where $$a(R_M, X_M, R, X) = c_R \frac{|R_M - (R - xR_0)|^2}{|R|^d} + c_X \frac{|X_M - X|^2}{|X|^d} + c_Z \frac{|Z_M - Z|^2}{|Z|^d},$$

the second evaluation function comprising:

$$B(\vec{P}) = \sum_{n=m+1}^{N} b(R_M(f_n, \vec{P}), X_M(f_n, \vec{P}), R(f_n) - (1-x)R_0, X(f_n)),$$

where $$b(R_M, X_M, R, X) = c_R \frac{|R_M - (R - (1-x)R_0)|^2}{|R|^d} + c_X \frac{|X_M - X|^2}{|X|^d} + c_Z \frac{|Z_M - Z|^2}{|Z|^d},$$

and, for each of the first and the second evaluation functions, where $0 \leq x \leq 1$, $\vec{P} = (P_1, P_2, \ldots P_K)$ is a circuit constant vector storing the values of the circuit elements and d, $C_R$, $C_X$, and $C_Z$ are positive real numbers or zero;
(e) applying the estimated impedance calculated in step (c) and the measured impedance inputted in step (b) to the first and the second evaluation functions determined in step (d);
(f) adjusting values of the estimated impedance to minimize the error between the estimated impedance and the measured impedance using the first evaluation function, thereby generating a part of element values of the equivalent circuit model of the passive element;
(g) adjusting the values of the estimated impedance to minimize the error between the estimated impedance and the measured impedance using the second evaluation function, thereby generating a further part of the element values of the equivalent circuit model of the passive element; and
(h) storing the part of the element values and the further part of the element values.

* * * * *

UNITED STATES PATENT AND TRADEMARK OFFICE
CERTIFICATE OF CORRECTION

PATENT NO. : 7,266,485 B2
APPLICATION NO. : 10/258700
DATED : September 4, 2007
INVENTOR(S) : Hiroyuki Maeshima et al.

It is certified that error appears in the above-identified patent and that said Letters Patent is hereby corrected as shown below:

On the Title Page, FIELD [54], and col. 1 "METHOD FOR MAKING" should read --METHOD FOR DERIVING--.

At Column 11, line 22, "$|R_M - (R - R_O/2)|^2$" should read --$|R_M - (R - xR_o)|^2$--.

At Column 13, line 60, "$P=(P_1, P_2,...P_K)$" should read -- $\vec{P} = (P_1, P_2, \cdots P_K)$ --.

Signed and Sealed this

First Day of July, 2008

JON W. DUDAS
*Director of the United States Patent and Trademark Office*